United States Patent
Potempa

(10) Patent No.: US 7,332,913 B2
(45) Date of Patent: Feb. 19, 2008

(54) METHOD AND APPARATUS FOR DETERMINING TO WHICH BATTERY CELL IN A STRING OF BATTERY CELLS A TEST INSTRUMENT IS CONNECTED

(75) Inventor: Edward M. Potempa, Pittstown, NJ (US)

(73) Assignee: BTECH, Inc., Rockaway, NJ (US)

( * ) Notice: Subject to any disclaimer, the term of this patent is extended or adjusted under 35 U.S.C. 154(b) by 41 days.

(21) Appl. No.: 11/413,366

(22) Filed: Apr. 28, 2006

(65) Prior Publication Data
US 2007/0252555 A1   Nov. 1, 2007

(51) Int. Cl.
*G01N 27/416* (2006.01)
(52) U.S. Cl. .................................................. 324/433
(58) Field of Classification Search ................ 324/426, 324/427, 430, 433; 320/107, 114; 340/625

See application file for complete search history.

(56) References Cited

U.S. PATENT DOCUMENTS

| | | | | |
|---|---|---|---|---|
| 6,160,376 A | * | 12/2000 | Kumar et al. | 320/116 |
| 6,424,158 B2 | * | 7/2002 | Klang | 324/433 |
| 6,810,338 B2 | * | 10/2004 | Mercke et al. | 702/63 |
| 2002/0008523 A1 | * | 1/2002 | Klang | 324/429 |

* cited by examiner

*Primary Examiner*—Edward H Tso
(74) *Attorney, Agent, or Firm*—David L. Davis

(57) ABSTRACT

A method and apparatus for determining to which battery cell in a string of battery cells between a pair of busses a test instrument is connected. Knowing the average voltage of the battery cells in the string, the voltage from one of the busses to the side furthest from that bus of the cell of interest is measured, and that measured voltage is compared with a voltage range calculated as a multiple of the average voltage.

3 Claims, 3 Drawing Sheets

METHOD AND APPARATUS FOR DETERMINING TO WHICH BATTERY CELL IN A STRING OF BATTERY CELLS A TEST INSTRUMENT IS CONNECTED

BACKGROUND OF THE INVENTION

This invention relates to the testing of individual battery cells in a battery backup system having a plurality of battery cells arranged in parallel strings of serially connected battery cells and, more particularly, to a method and apparatus for determining to which battery cell in a string of battery cells a test instrument is connected.

Large battery systems are commonly used to provide backup power in case there is a failure of the commercial power grid. Typically, such a backup system includes a single string, or a plurality of parallel strings, of serially connected rechargeable battery cells and a charger connected to the commercial power grid for maintaining the charge on the battery cells. An inverter is coupled between the strings of battery cells and the load, which inverter is enabled upon the detection of a failure of the commercial power grid. In some applications, the inverter may be continuously operational to power the load with energy from the charger during the time that commercial power is available. Many of these battery backup systems, called "uninterruptible power supplies" (UPS), are configured such that the load is never aware of any failure of the commercial power grid because the battery system immediately supplies the necessary energy upon detecting a failure of the commercial power grid.

A typical installation of such an uninterruptible power supply is between the commercial power grid and a large computer system used by financial, communications, manufacturing and other commercial industries. If the battery system is taken "off-line" for any reason, the necessary protection against a power outage is lost for the time that the battery system is not connected plus the time for recharging, if a significant amount of charge has been removed during the off-line period of time. However, such battery backup systems must be monitored on a regular basis to insure that protection from commercial power grid failure is always available. Therefore, systems have been developed to perform such monitoring while the battery backup system remains on-line.

Impedance measurement is a method by which the condition of a battery cell may be assessed without taking the battery system off-line. Impedance measurements typically impose a current (hereinafter called the "loading current") on the battery cell being evaluated and measure the resulting voltage. Various commercially available test instruments function this way. Using Kelvin connections, these instruments impose a current on just the battery cell being measured. After a measurement has been made, the operator moves the Kelvin clips to the next battery cell, reads the value, moves the clips to the next battery cell, and continues in this manner until all the battery cells have been measured. The test instrument stores all the readings it has taken but, until now, did not know to which battery cell in the string it was connected, since the operator is not constrained to any particular order in which to check the battery cells. It would therefore be desirable to have a method and apparatus embodied in a test instrument for determining to which battery cell in a string of battery cells the test instrument is connected.

SUMMARY OF THE INVENTION

The present invention is for use in a system having a plurality of substantially identical rechargeable battery cells arranged in at least one string between a pair of busses. The at least one string has a plurality of serially connected battery cells to form a battery system. This invention provides a method for determining across which battery cell in one of the at least one string a test instrument is connected. The inventive method comprises the steps of:
 a) determining the average voltage of a battery cell in the one of the at least one string;
 b) measuring the voltage from one of the pair of busses to the side of the test instrument closest to the other of the pair of busses;
 c) setting n=1;
 d) multiplying the average voltage by (n+0.5) to obtain $V_{HI}$;
 e) multiplying the average voltage by (n−0.5) to obtain $V_{LO}$;
 f) determining whether the measured voltage is between $V_{HI}$ and $V_{LO}$; and
 g) if the measured voltage is not between $V_{HI}$ and $V_{LO}$, setting n=n+1 and repeating steps d)-f) until it is determined that the measured voltage is between $V_{HI}$ and $V_{LO}$;
 whereby when it is determined that the measured voltage is between $V_{HI}$ and $V_{LO}$, this indicates that the test instrument is connected across the $n^{th}$ battery cell counting from the one of the pair of busses.

This invention also provides a test instrument for taking a measurement across a selected battery cell in a string of battery cells between a pair of busses, wherein the test instrument also determines to which battery cell in the string the test instrument is connected. The test instrument is provided with the average voltage of a battery cell in the string and comprises first and second measurement leads adapted for connection across the selected battery cell, a third lead adapted for connection to one of the pair of busses, a voltmeter connected between the third lead and that one of the first and second measurement leads which is adapted to be connected furthest from the one of the pair of busses, and means for determining what integral multiple of the average voltage is closest to the voltage measured by the voltmeter.

BRIEF DESCRIPTION OF THE DRAWINGS

The foregoing will be more readily apparent from reading the following description in conjunction with the drawings in which like elements in different figures thereof are identified by the same reference numeral and wherein.

DETAILED DESCRIPTION

Figure 1:
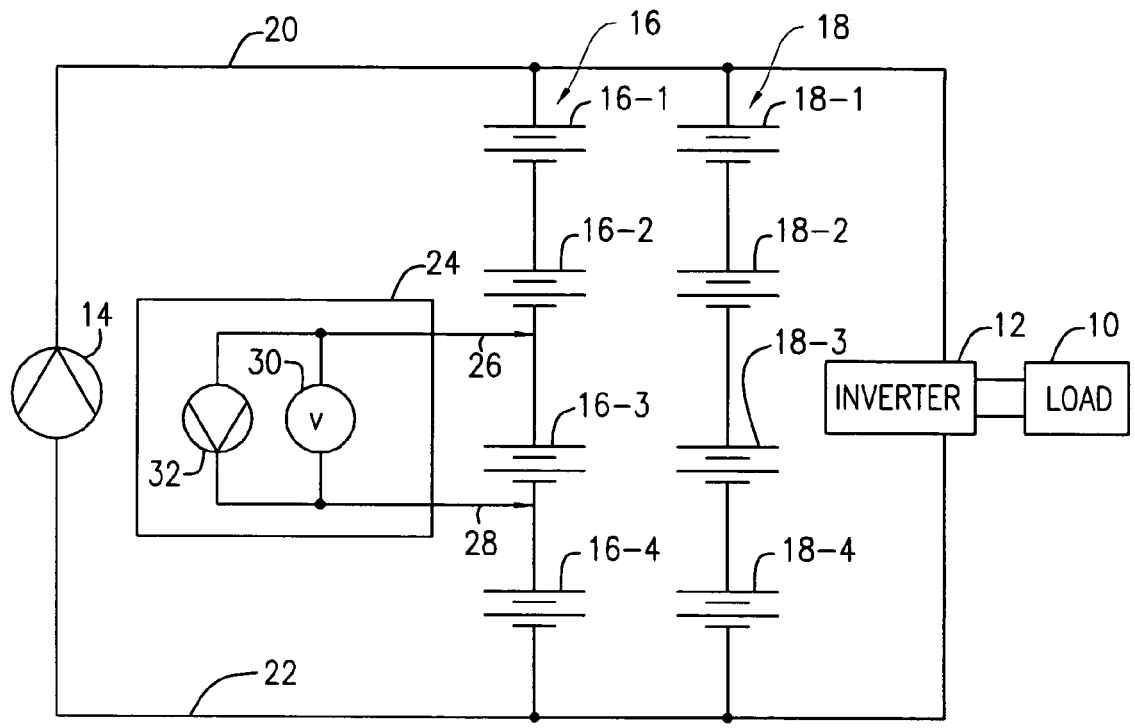
FIG. 1 is a simplified schematic circuit diagram illustrating a prior art connection of a test instrument in a UPS system with two strings and four battery cells per string.

FIG. 1 shows a typical prior art battery backup system coupled to a load 10 through an inverter 12. The battery backup system includes at least one parallel string of serially connected rechargeable battery cells. To simplify the drawings and the following discussion, the battery backup system shown in FIG. 1 is illustrated as having two strings with four battery cells in each string, it being understood that an actual system would typically comprise many more strings each having many more (possibly one hundred or more) battery cells. A charger 14 is connected across the strings to maintain the battery cells at their full level of charge when the commercial power grid is operational. What is not shown in FIG. 1 is the commercial power grid, the direct connection of the charger 14 to the commercial power grid, the direct connection of the load 10 to the commercial power grid, or the arrangement which disconnects the load 10 from the commercial power grid upon detection of commercial power grid failure, since these are conventional and well known in the art.

As illustrated, the battery backup system includes a first string 16 of battery cells 16-1, 16-2, 16-3 and 16-4, and a second string 18 of battery cells 18-1, 18-2, 18-3 and 18-4. The strings 16 and 18 are connected in parallel between a pair of busses 20 and 22. A test instrument 24 having first and second measurement leads 26 and 28 is connected across battery cell 16-3. The test instrument 24 includes a voltmeter 30 and a regulated current source 32. The test instrument 24 is used to measure the internal impedance of the battery cell 16-3, as is known in the art. However, as explained above, the prior art instrumentation does not have a way of determining to which battery cell in the string it is connected.

Figure 2:
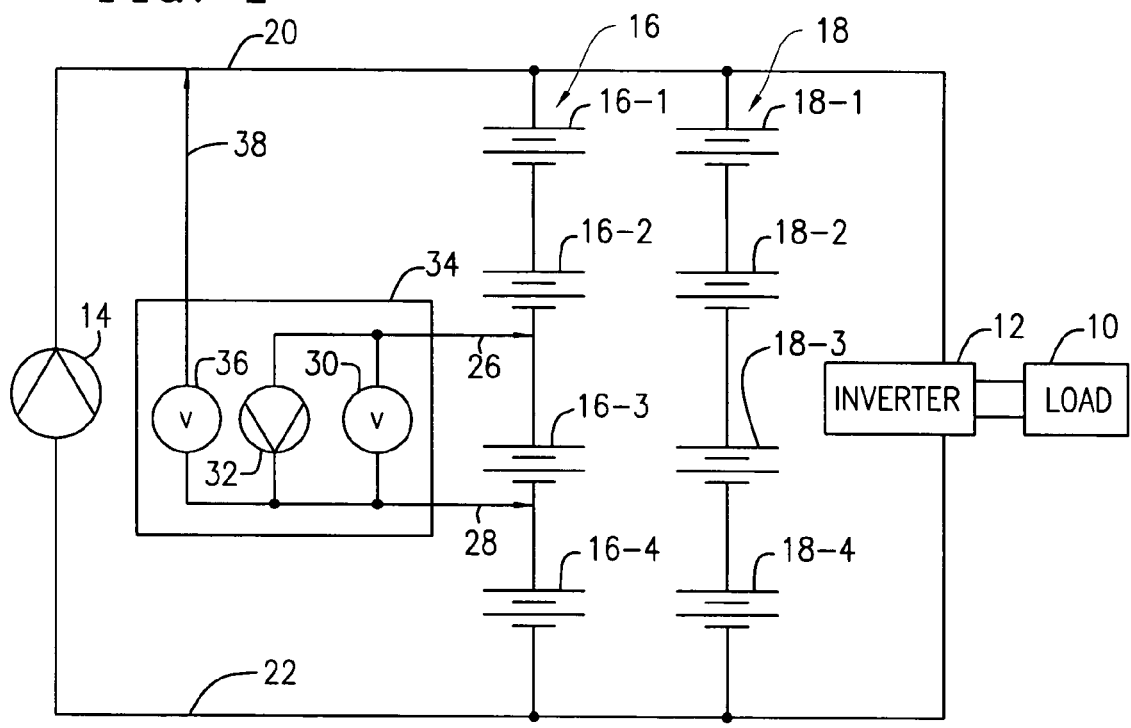
FIG. 2 is a simplified schematic circuit diagram similar to FIG. 1 illustrating a test instrument for practicing the inventive method.

According to the present invention, as shown in FIG. 2, a modified test instrument 34, in addition to the measurement leads 26 and 28, the voltmeter 30 and the current source 32, also includes a voltmeter 36 and a third lead 38. While the measurement leads 26 and 28 are adapted to be connected across a selected battery cell for the measurement thereof, the third lead 38 is adapted to be connected to a selected one of the busses 20 and 22. The voltmeter 36 is connected between the third lead 38 and that one of the measurement leads 26 and 28 which is adapted to be connected furthest from the selected one of the busses 20 and 22 to which the third lead 38 is connected. As illustrated, the third lead 38 is connected to the positive bus 20 and the voltmeter 36 is connected between the third lead 38 and the second measurement lead 28 which is connected to the negative terminal of the battery cell 16-3, while the first measurement lead 26 is connected to the positive terminal of the battery cell 16-3. As will be described in further detail hereinafter, knowing the average voltage of the battery cells in the string 16, and the voltage measured by the voltmeter 36, the test instrument 34 can determine to which battery cell in the string 16 it is connected by determining what integral multiple of the average voltage of the battery cells in the string 16 is closest to the voltage measured by the voltmeter 36.

Figure 3:
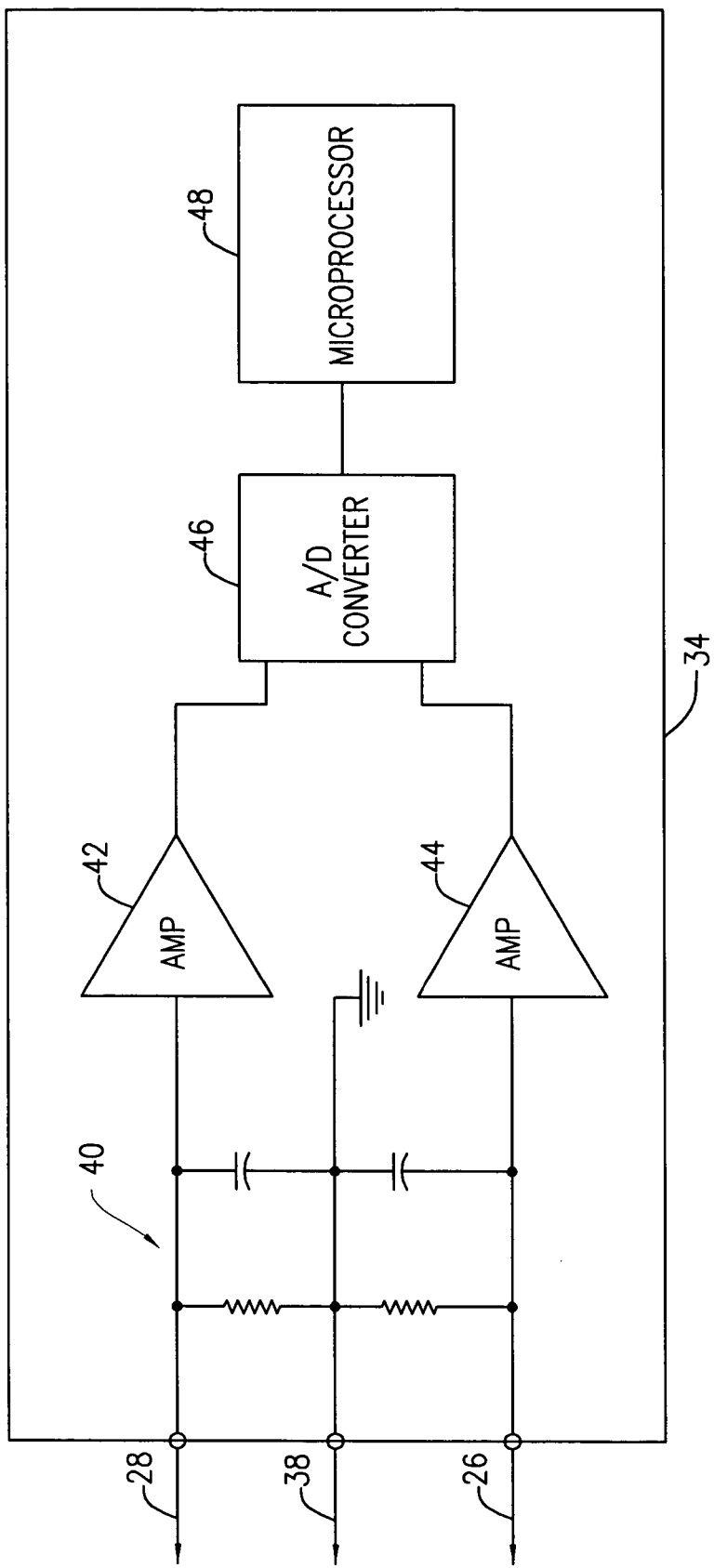
FIG. 3 is a detailed schematic circuit diagram of an illustrative embodiment of the inventive test instrument.

FIG. 3 illustrates an embodiment of a practical implementation of the inventive test instrument 34 which operates in accordance with the inventive method to determine to which battery cell in the string of battery cells the test instrument 34 is connected. As shown, the leads 26, 28 and 38 are connected through a high impedance network 40 to the inputs of the amplifiers 42 and 44. Thus, the output of the amplifier 42 corresponds to the reading of the voltmeter 36 (i.e., the voltage from the bus 20 to the negative terminal of the battery cell 16-3) and the output of the amplifier 44 corresponds to the reading of the voltmeter 30 (i.e., the voltage across the battery cell 16-3). The outputs of the amplifiers 42 and 44 are provided as inputs to the analog-to-digital converter 46, which is effective to provide digital representations of the measured voltages to the microprocessor 48.

Figure 4:
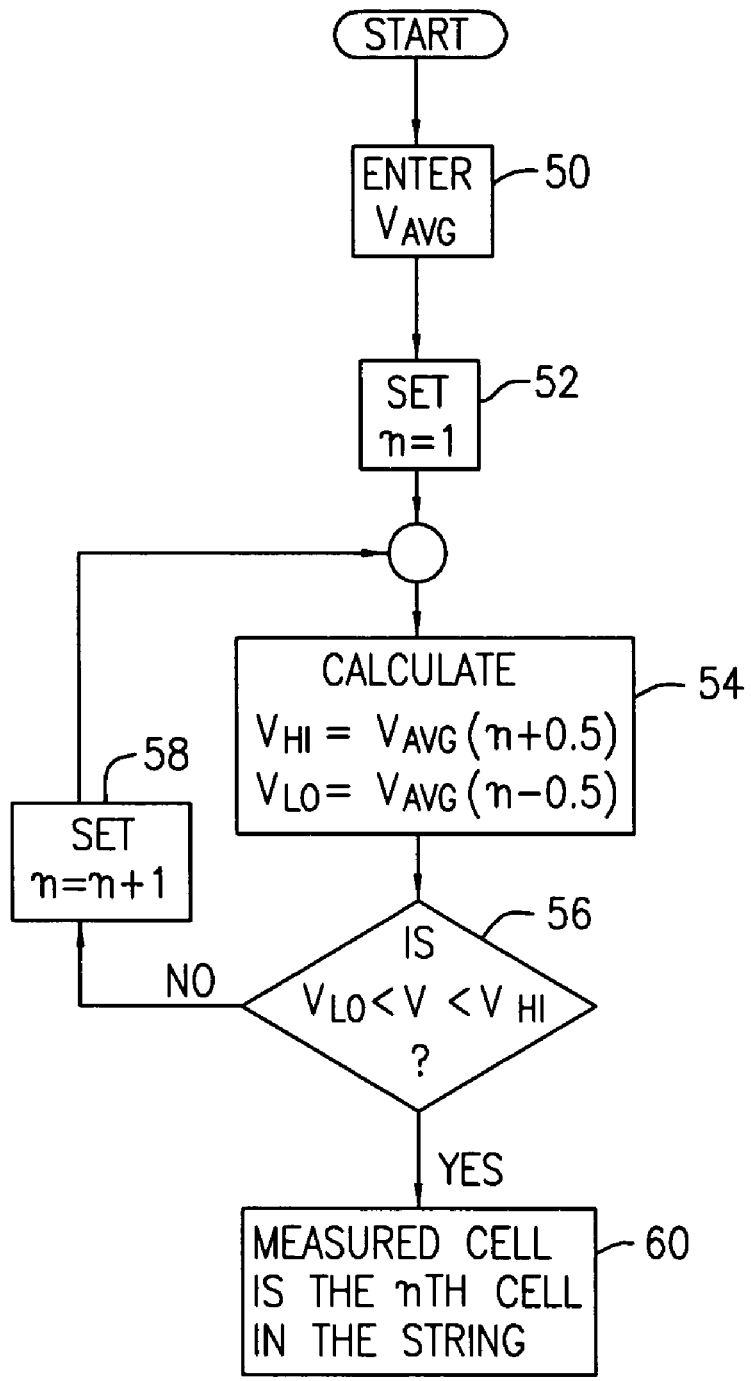
FIG. 4 is a flowchart showing illustrative steps in practicing the inventive method.

The microprocessor 48 operates in accordance with the method illustrated by the flowchart of FIG. 4 to determine to which battery cell in the string of battery cells the test instrument 34 is connected. First, the operator has to enter the average voltage ($V_{AVG}$) of all the battery cells in the string of interest, as shown by the block 50. This is a known value. The microprocessor 48 then sets n=1, as shown by the block 52. The microprocessor 48 then multiplies the average voltage by (n+0.5) to obtain $V_{HI}$ and multiplies the average voltage by (n−0.5) to obtain $V_{LO}$, as shown by the block 54. The microprocessor 48 then checks to see whether the voltage measured between the bus 20 and the negative terminal of the battery cell under test (as represented by the output of the amplifier 42) is within the range defined by $V_{LO}$ and $V_{HI}$, as shown by the block 56. If the measured voltage is not within that range, n is incremented by one, as shown by the block 58, and the steps shown by the blocks 54 and 56 are repeated until the measured voltage is within the calculated range. When it is determined that the measured voltage is within the calculated range, the value of n used in the range calculation corresponds to the position of the battery cell under test, counting from the bus 20, as shown by the block 60. This value of n can be displayed for the operator. It can also be stored in the microprocessor 48 along with any readings and calculations for that battery cell.

Accordingly, there have been disclosed an improved method for use in a test instrument, and a test instrument, which determines to which battery cell in a string of battery cells the test instrument is connected. While preferred embodiments of the present invention have been disclosed herein, it will be appreciated by those of skill in the art that various adaptations and modifications to the disclosed embodiments are possible. Thus, for example, the disclosed invention can be modified to count from the negative bus, instead of from the positive bus. It is therefore intended that this invention be limited only by the scope of the appended claims.

What is claimed is:

1. In a system having a plurality of substantially identical rechargeable battery cells arranged in at least one string between a pair of busses, said at least one string having a plurality of serially connected battery cells to form a battery system, a method for determining across which battery cell in one of said at least one string a test instrument is connected, the method comprising the steps of:

a) determining the average voltage of a battery cell in said one of said at least one string;

b) measuring the voltage from one of said pair of busses to the side of said test instrument closest to the other of said pair of busses;

c) setting n=1;

d) multiplying the average voltage by (n+0.5) to obtain $V_{HI}$;

e) multiplying the average voltage by (n−0.5) to obtain $V_{LO}$;

f) determining whether the measured voltage is between $V_{HI}$ and $V_{LO}$; and g) if the measured voltage is not between $V_{HI}$ and $V_{LO}$, setting n=n+1 and repeating steps d)-f) until it is determined that the measured voltage is between $V_{HI}$ and $V_{LO}$;

wherein n is an integer, $V_{HI}$ is a calculated variable representing the high end of a voltage range, and $V_{LO}$ is a calculated variable representing the low end of a voltage range;

whereby when it is determined that the measured voltage is between $V_{HI}$ and $V_{LO}$, this indicates that the test instrument is connected across the $n^{th}$ battery cell counting from said one of said pair of busses.

2. A test instrument for taking a measurement across a selected battery cell in a string of battery cells between a pair of busses and determining to which battery cell in said string the test instrument is connected, wherein the test instrument is provided with the average voltage of a battery cell in said string, the test instrument comprising:

first and second measurement leads adapted for connection across said selected battery cell;

a third lead adapted for connection to one of said pair of busses;

a voltmeter connected between said third lead and that one of said first and second measurement leads which is adapted to be connected furthest from said one of said pair of busses; and means for determining what integral multiple of said average voltage is closest to the voltage measured by said voltmeter.

3. A test instrument for taking a measurement across a selected battery cell in a string of battery cells between a pair of busses and determining to which battery cell in said string the test instrument is connected, wherein the test instrument is provided with the average voltage of a battery cell in said string, the test instrument comprising:

a first lead adapted for connection to one of said pair of busses;

a second lead adapted for connection to that terminal of said selected battery cell which is closest to said one of said pair of busses;

a third lead adapted for connection to the other terminal of said selected battery cell;

a first high impedance network connected between said first and third leads;

a second high impedance network connected between said second and third leads;

an analog to digital converter having first and second inputs;

a first amplifier stage having its input connected to said first lead and its output connected to said first input of said analog to digital converter;

a second amplifier stage having its input connected to said second lead and its output connected to said second input of said analog to digital converter; and a microprocessor connected to an output of said analog to digital converter and operative to determine to which battery cell in said string the test instrument is connected by performing the steps of:

a) determining the voltage between said first and third leads;

b) setting n=1;

c) multiplying the average voltage by (n+0.5) to obtain $V_{HI}$;

d) multiplying the average voltage by (n−0.5) to obtain $V_{LO}$;

e) determining whether the determined voltage is between $V_{HI}$ and $V_{LO}$; and f) if the determined voltage is not between $V_{HI}$ and $V_{LO}$, setting n=n+1 and repeating steps c)-e) until it is determined that the determined voltage is between $V_{HI}$ and $V_{LO}$;

wherein n is an integer, $V_{HI}$ is a calculated variable representing the high end of a voltage range, and $V_{LO}$ is a calculated variable representing the low end of a voltage range;

whereby when it is determined that the determined voltage is between $V_{HI}$ and $V_{LO}$, this indicates that the test instrument is connected across the $n^{th}$ battery cell counting from said one of said pair of busses.

* * * * *